United States Patent
Lin et al.

(10) Patent No.: US 8,114,721 B2
(45) Date of Patent: Feb. 14, 2012

(54) METHOD OF CONTROLLING GATE THICKNESS IN FORMING FINFET DEVICES

(75) Inventors: Shun Wu Lin, Taichung (TW); Peng-Soon Lim, Kluang (MY); Matt Yeh, Hsinchun (TW); Ouyang Hui, Chubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 132 days.

(21) Appl. No.: 12/638,958

(22) Filed: Dec. 15, 2009

(65) Prior Publication Data

US 2011/0143510 A1 Jun. 16, 2011

(51) Int. Cl.
*H01L 21/84* (2006.01)
*H01L 21/00* (2006.01)

(52) U.S. Cl. ........ 438/149; 438/157; 438/164; 438/231; 438/299; 438/585; 257/E21.409

(58) Field of Classification Search .................. None
See application file for complete search history.

(56) References Cited

U.S. PATENT DOCUMENTS

| | | | |
|---|---|---|---|
| 5,658,417 A | 8/1997 | Watanabe et al. | |
| 6,065,481 A | 5/2000 | Fayfield et al. | |
| 6,299,724 B1 | 10/2001 | Fayfield et al. | |
| 6,622,738 B2 | 9/2003 | Scovell | |
| 6,642,090 B1 * | 11/2003 | Fried et al. | 438/164 |
| 6,706,571 B1 | 3/2004 | Yu et al. | |
| 6,740,247 B1 | 5/2004 | Han et al. | |
| 6,830,994 B2 | 12/2004 | Mitsuki et al. | |
| 6,858,478 B2 | 2/2005 | Chau et al. | |
| 7,084,079 B2 | 8/2006 | Conti et al. | |
| 7,157,351 B2 | 1/2007 | Cheng et al. | |
| 7,190,050 B2 | 3/2007 | King et al. | |
| 7,247,887 B2 | 7/2007 | King et al. | |
| 7,265,008 B2 | 9/2007 | King et al. | |
| 7,315,994 B2 | 1/2008 | Aller et al. | |
| 7,323,375 B2 * | 1/2008 | Yoon et al. | 438/164 |
| 7,338,614 B2 | 3/2008 | Martin et al. | |
| 7,351,622 B2 | 4/2008 | Buh et al. | |
| 7,374,986 B2 | 5/2008 | Kim et al. | |
| 7,396,710 B2 * | 7/2008 | Okuno | 438/149 |

(Continued)

OTHER PUBLICATIONS

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

(Continued)

*Primary Examiner* — Zandra Smith
*Assistant Examiner* — Khanh Duong
(74) *Attorney, Agent, or Firm* — Lowe Hauptman Ham & Berner, LLP

(57) ABSTRACT

A method of forming a FinFET device is provided. In one embodiment, a fin is formed on a substrate. A gate structure is formed over the fin, the gate structure having a dielectric layer and a conformal first polysilicon layer formed above the dielectric layer. An etch stop layer is formed above the first polysilicon layer and thereafter a second polysilicon layer is formed above the etch stop layer. The second polysilicon layer and the etch stop layer are removed. A metal layer is formed above the first polysilicon layer. The first polysilicon layer is reacted with the metal layer to silicide the first polysilicon layer. Any un-reacted metal layer is thereafter removed and source and drain regions are formed on opposite sides of the fin.

20 Claims, 4 Drawing Sheets

U.S. PATENT DOCUMENTS

| | | | |
|---|---|---|---|
| 7,407,847 | B2 | 8/2008 | Doyle et al. |
| 7,494,862 | B2 | 2/2009 | Doyle et al. |
| 7,508,031 | B2 | 3/2009 | Liu et al. |
| 7,528,465 | B2 | 5/2009 | King et al. |
| 7,550,332 | B2 * | 6/2009 | Yang .......................... 438/152 |
| 7,605,449 | B2 | 10/2009 | Liu et al. |
| 7,682,911 | B2 * | 3/2010 | Jang et al. .................... 438/283 |
| 7,798,332 | B1 | 9/2010 | Brunet |
| 2005/0153490 | A1 | 7/2005 | Yoon et al. |
| 2006/0258156 | A1 | 11/2006 | Kittl |
| 2007/0015334 | A1 | 1/2007 | Kittl et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2008/0085580 | A1 | 4/2008 | Doyle et al. |
| 2008/0290470 | A1 | 11/2008 | King et al. |
| 2008/0296632 | A1 | 12/2008 | Moroz et al. |
| 2009/0026540 | A1 | 1/2009 | Sasaki et al. |
| 2009/0181477 | A1 | 7/2009 | King et al. |
| 2010/0207211 | A1 | 8/2010 | Sasaki et al. |

OTHER PUBLICATIONS

Shikida, Mitsuhiro, et al., "Comparison of Anisotropic Etching Properties Between KOH and TMAH Solutions", IEEE Xplore, Jun. 30, 2010, pp. 315-320.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

* cited by examiner

METHOD OF CONTROLLING GATE THICKNESS IN FORMING FINFET DEVICES

CROSS-REFERENCE TO RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTI-FUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present disclosure relates generally to the fabrication of FinFET gate structures, and more particularly, to a method of controlling the gate thickness in forming FinFET gate structures.

BACKGROUND

Double-gate MOSFETs represent new devices that are candidates for succeeding existing planar MOSFETs. A FinFET is one example of a double-gate structure that includes a channel formed in a vertical fin. As the size of FinFET structures continue to shrink down into the deep sub-micron region, it is desirable to use metal gates, such as FinFET gates to further reduce resistance as well as gate conductance, eliminate polysilicon depletion, and tune work function performance. A FinFET gate can be formed by depositing a metal layer (such as Ni, Ti, Co, Pt, etc.) over an exposed polysilicon gate layer, pre-annealing to provide the required diffusion, removing the unreacted metal, and then annealing the semiconductor structure to form a more stable silicide alloy phase. The deposited metal reacts with the exposed polysilicon gate to transform the poly gate into a silicided gate.

While FinFET gate structures provide the above advantages, they introduce difficulties in the manufacturing control process that need to be overcome. One such difficulty with conventional FinFET fabrication methods is in controlling the thickness uniformity of the exposed polysilicon gate layer. Prior to depositing the metal layer over the exposed polysilicon layer, the polysilicon layer is typically etched back by an etch procedure, such as dry or wet etch to reduce its thickness. This etch process typically produces a poly layer having non-uniform thickness (i.e., dishing profile). This may result in incomplete silicidation or inappropriate silicidation phase of the FinFET gate leading to poor device performance.

For this reason and other reasons that will become apparent upon reading the following detailed description, there is a need for a method to precisely control the thickness of the polysilicon gate layer that avoids the shortcomings associated with conventional methods of forming FinFETs.

SUMMARY

The present disclosure is directed to a method of forming a FinFET device. In one embodiment, a fin is formed on a substrate. A gate structure is formed over the fin, the gate structure having a dielectric layer and a first polysilicon layer formed conformally above the dielectric layer. An etch stop layer is formed above the first polysilicon layer and thereafter a second polysilicon layer is formed above the etch stop layer. The second polysilicon layer and the etch stop layer are removed. A metal layer is formed above the conformal first polysilicon layer. The first polysilicon layer is reacted with the metal layer to silicide the first polysilicon layer. Any un-reacted metal layer is thereafter removed and source and drain regions are formed on opposite sides of the fin.

BRIEF DESCRIPTION OF DRAWINGS

The features, aspects, and advantages of the disclosure will become more fully apparent from the following detailed description, appended claims, and accompanying drawings in which:

DETAILED DESCRIPTION

In the following description, numerous specific details are set forth to provide a thorough understanding of embodiments of the present invention. However, one having an ordinary skill in the art will recognize that embodiments of the invention can be practiced without these specific details. In some instances, well-known structures and processes have not been described in detail to avoid unnecessarily obscuring embodiments of the present invention.

Exemplary structures and methods are provided below for fabricating a FinFET device according to embodiments of the present invention. Although the exemplary embodiments are described as a series of steps, it will be appreciated that this is for illustration and not for the purpose of limitation. For example, some steps may occur in a different order than illustrated yet remain within the scope of the invention. In addition, not all illustrated steps may be required to implement the present invention. Furthermore, the structures and methods according to embodiments of the invention may be implemented in association with the fabrication or processing of other semiconductor structures not illustrated.

Figure 1:
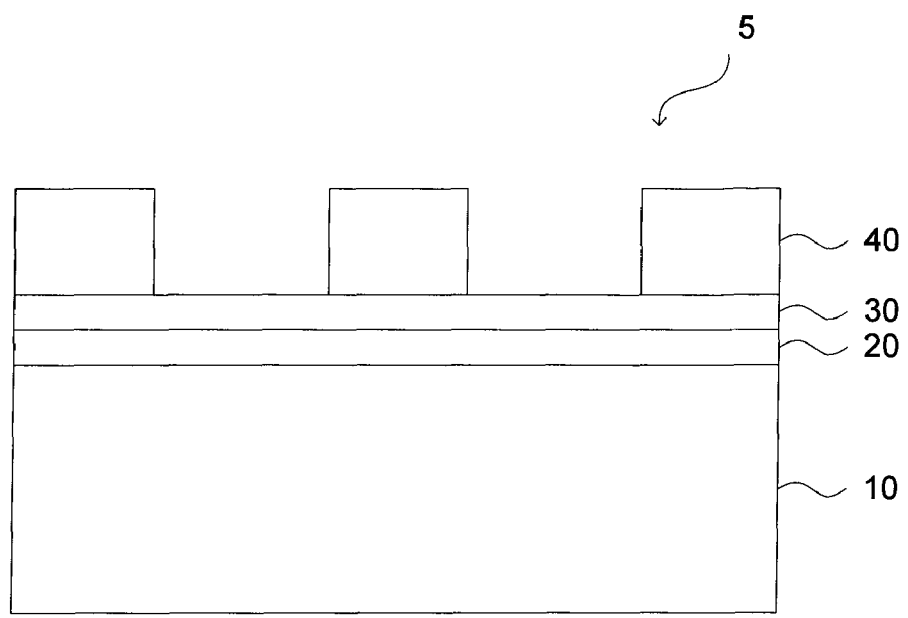
FIGS. 1-7 are cross-sectional views of one embodiment of a semiconductor device during various fabrication stages thereof.

Generally, embodiments of the present invention provide silicided semiconductor structures and methods of forming these structures. FIGS. 1-7 illustrate an exemplary embodiment of the invention. Turning now to FIG. 1, there is shown a semiconductor device 5 formed in accordance with an embodiment of the present invention. Semiconductor device 5 may include a silicon on insulator (SOI) structure that includes a silicon substrate 10, a pad oxide layer 20 and a nitride layer 30 formed on the pad oxide layer 20. Nitride layer 30 acts as a stop layer during a subsequent chemical mechanical planarization (CMP) process. Pad oxide layer 20 and nitride layer 30 may be formed on substrate 10 in a conventional manner and will later be used to form parts of a fin.

In one exemplary implementation, pad oxide layer 20 may include a silicon oxide, such as $SiO_2$, or other dielectric materials and may have a thickness ranging from about 30 Angstroms to about 150 Angstroms. Nitride layer 30 may include silicon nitride and in an exemplary embodiment, be deposited at a thickness ranging from about 200 Angstroms to about 1,000 Angstroms. Next, a photoresist material may be deposited and patterned to form a patterned photoresist layer 40 that will be used for subsequent processing. The photoresist material may be deposited and patterned in any conventional manner.

Figure 2:
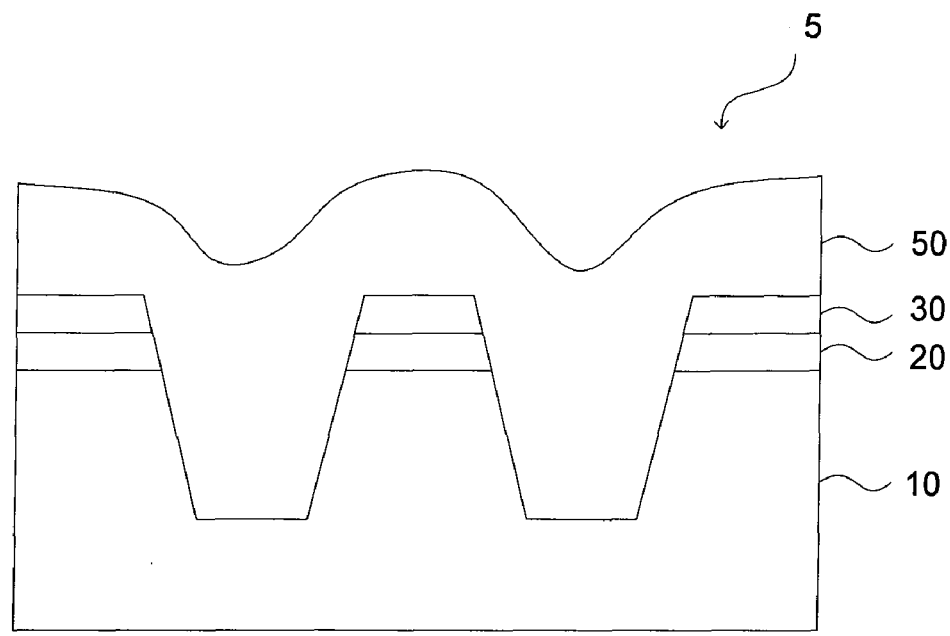
Figure 3:
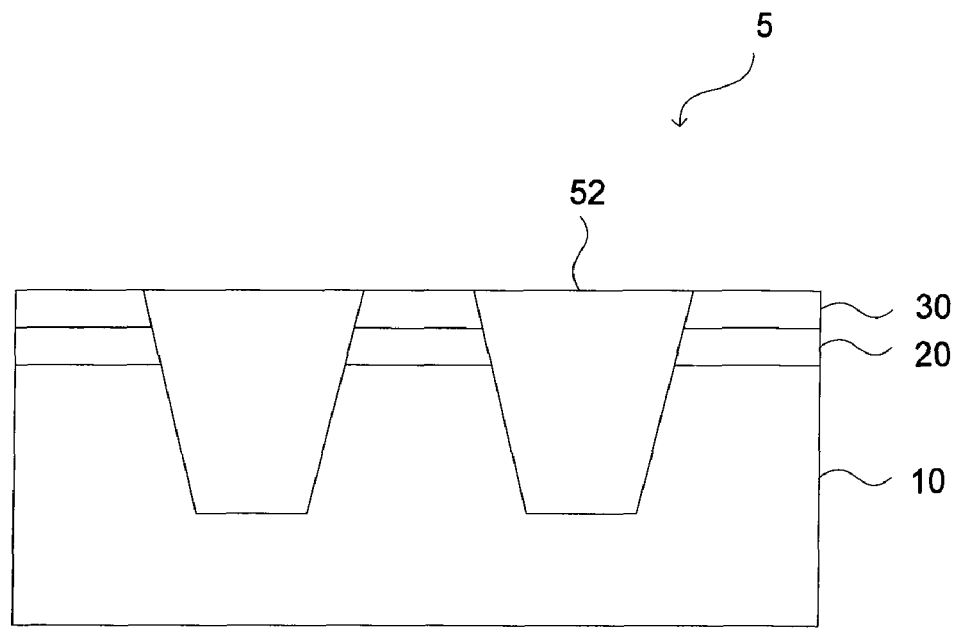
Figure 4:
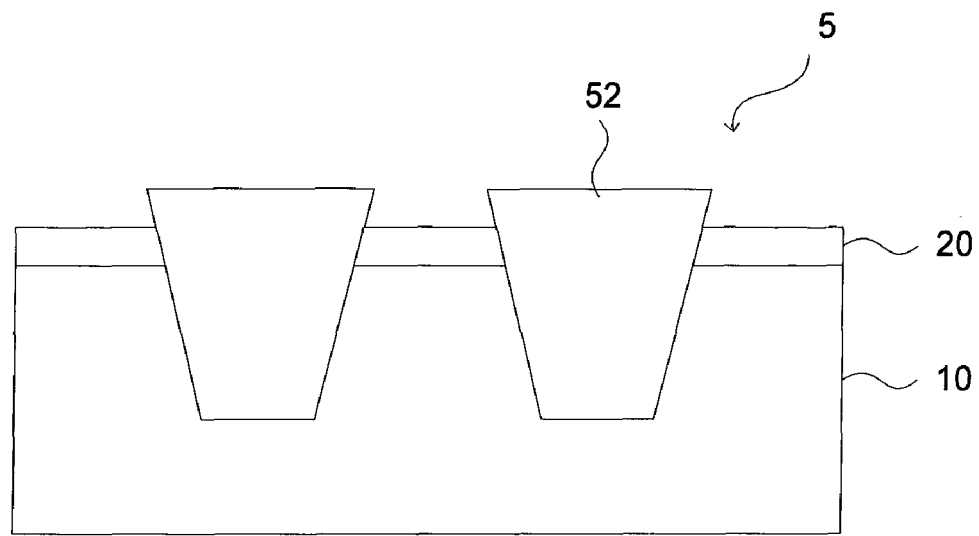

Semiconductor device 5 may then be etched. In an exemplary implementation, nitride layer 30, pad oxide layer 20 and portions of the substrate may be etched in a conventional manner to form parts of a fin. Source and drain regions (not shown) are formed on opposite sides of the fin. Following the etching step, an oxide layer 50 is blanket deposited on semiconductor device 5 by conventional processes, as shown in FIG. 2. The oxide layer 50 is thereafter planarized by conventional planarization processes, such as for example chemical mechanical polishing (CMP). CMP processing continues until the top surface of the nitride layer 30 is substantially reached to form shallow trench isolation (STI) layers 52 in semiconductor device 5, as shown in FIG. 3. The nitride layer 30 may then be removed using, for example, a wet etching procedure, as illustrated in FIG. 4.

Figure 5:
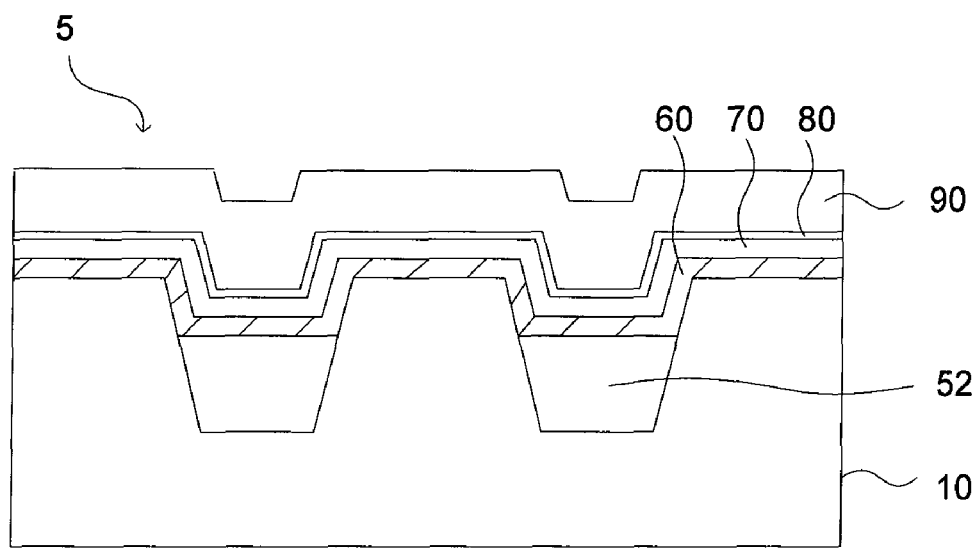

With reference now to FIG. 5, the pad oxide layer 20 may then be removed by conventional removal processes to expose portions of the substrate 10 and the STI layers 52 are etched back by conventional etching chemistries. In the formation of the FinFET gate structure over the fin (not shown) according to an exemplary embodiment of the present invention, a dielectric layer 60 is deposited over the substrate 10 and the STI layers 52. Dielectric layer 60 comprises a non-conductive material (e.g., silicon oxide (i.e., $SiO_2$), silicon oxynitride, or a high dielectric constant ("high k") material such as hafnium-based metal-oxide). Depending on the material used for the dielectric layer 60, the dielectric layer 60 can be formed by a variety of techniques including but not limited to thermal oxidation, thermal oxidation followed by a thermal nitridation, atomic layer deposition (ALD), or chemical vapor deposition (CVD). In one embodiment, the dielectric layer 60 has a thickness of from about 15 Angstroms to about 90 Angstroms, although other thicknesses are within the contemplated scope of the invention.

Whereas in the conventional method for forming FinFET gate structures where it would be difficult to control the thickness uniformity of the polysilicon layer prior to depositing a metal-containing layer for silicidation, an aspect of the present invention introduces an insertion layer or an etch stop layer in the gate structure prior to the silicidation phase. As will be discussed further below, this etch stop layer is generally sandwiched in-between one or more layers of polysilicon. During an etch-back procedure to remove the top polysilicon layer to stop at the etch stop layer and to remove the etch stop layer thereafter, embodiments of the present invention provide a precise way for controlling the polysilicon gate thickness.

Referring back to FIG. 5, a first polysilicon layer 70 is then conformally formed over the dielectric layer 60. The first polysilicon layer 70 may be formed by using conventional chemical vapor deposition (CVD) processes, such as for example by using a low-pressure chemical vapor deposition (LPCVD) process or an atomic layer deposition (ALD) process for conformal deposition. In some embodiments, the first polysilicon layer 70 has a thickness of from about 20 Angstroms to about 800 Angstroms, although other thicknesses are within the contemplated scope of the invention. In an aspect of the present invention, an insertion layer or etch stop layer 80 is thereafter formed over the first polysilicon layer 70 and is used as an etch stop. The etch stop layer 80 may comprise of oxide, silicon oxide, nitride, silicon nitride, silicon oxynitride, or some other appropriate material. It is understood that the selection of the material for the etch stop layer 80 is a matter of design choice—the material should be compatible with the MOSFET process flow and should have high etch selectivity relative to polysilicon. It is also understood that the thickness of the etch stop layer 80 is also a matter of design choice—the etch stop layer 80 must be sufficiently thick so as to protect the underlying first polysilicon layer 70 during over-etching. In one embodiment, the etch stop layer 80 has a thickness of from about 10 Angstroms to about 100 Angstroms, although other thicknesses are within the contemplated scope of the invention. The etch stop layer 80 can be formed by a variety of techniques (e.g., thermal oxidation, thermal oxidation followed by a thermal nitridation, atomic layer deposition (ALD), or chemical vapor deposition (CVD)).

A second polysilicon layer 90 is formed over the etch stop layer 80. Second polysilicon layer 90 is formed similarly to the first polysilicon layer 70 using conventional deposition procedures and materials. In some embodiments, the second polysilicon layer 90 has a thickness of from about 300 Angstroms to about 1,600 Angstroms, although other thicknesses are within the contemplated scope of the invention. The second polysilicon layer 90 is thereafter planarized by conventional planarization processes, such as for example chemical mechanical polishing (CMP).

Figure 6:
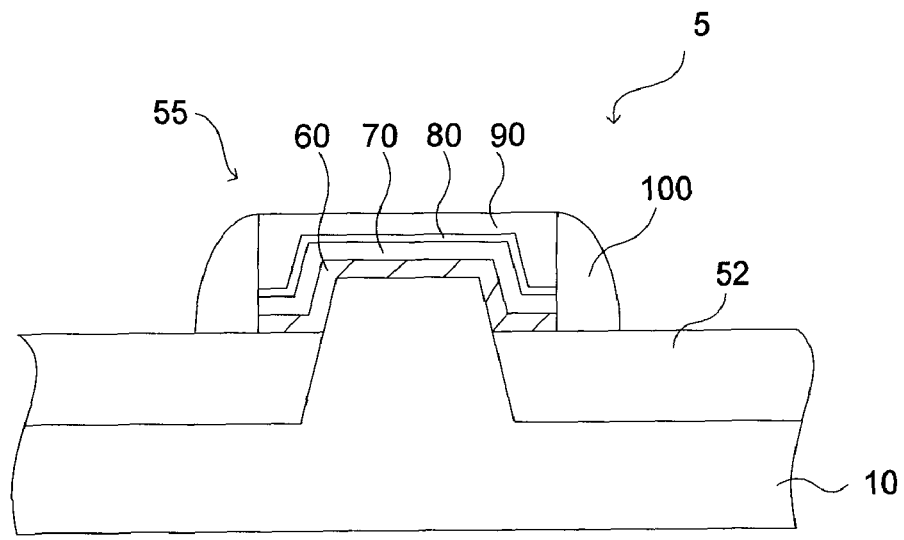

A hard mask layer (not shown) is formed atop the second polysilicon layer 90. The particular configuration of the hard mask may be based on the particular circuit requirements associated with the gate of the semiconductor device 5. The hard mask layer may comprise silicon oxide, silicon nitride, silicon oxynitride, or any other suitable material having high etch selectivity relative to polysilicon. The thickness of the hard mask layer may vary depending on the technique used in forming the same, the material of the hard mask itself, and the number of layers within the hard mask layer. This hard mask layer is patterned using conventional photolithographic techniques, such as by forming a photoresist layer (not shown)

atop the hard mask layer, patterning the photoresist layer, and using the patterned photoresist layer to pattern the hard mask layer in a subsequent etch step. The hard mask layer is then used as a pattern when etching underlying second polysilicon layer 90, etch stop layer 80, first polysilicon layer 70, and dielectric layer 60 using etching processes that are well-known in the art to form gate structure 55 as shown in FIG. 6. Sidewall spacers 100 are formed on the sidewalls of the gate structure 55. Sidewall spacers 100 may be formed by conformally depositing one or more layers of oxide or nitride, followed by anisotropic etching the same.

Figure 7:
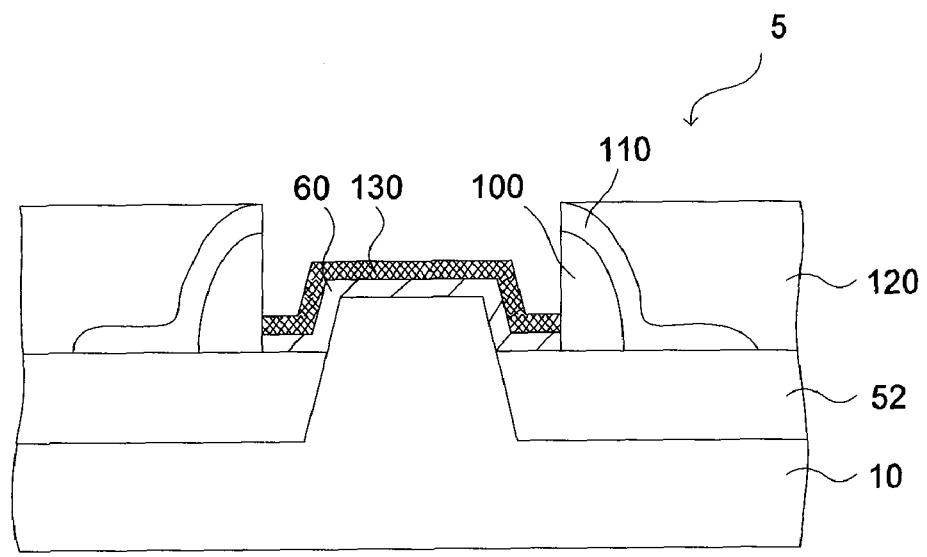

Referring now to FIG. 7, a stop layer 110 is deposited over the semiconductor device 5 followed by the deposition of an inter-layer dielectric (ILD) layer 120. ILD layer 120 may comprise of spun-on-glass (SOG), tetraethyl orthosilicate (TEOS) compound, high density plasma oxide, and the like, and in one embodiment is deposited to a thickness ranging from about 2,000 Angstroms to about 3,000 Angstroms. ILD layer 120 is then subjected to a chemical mechanical polish (CMP) process in which the top surface of the ILD layer 120 is planarized and lowered. CMP processing continues until the top surface of the stop layer 110 is substantially reached. Next, using an appropriate etch process such as dry etching or wet etching, portions of the stop layer 110 and the second polysilicon layer 90 can be removed. For example, semiconductor device 5 may be etched using reactants that have a high etch selectivity with respect to polysilicon. This enables the silicon material to be removed without removing significant portions of any of the surrounding dielectric layers, such as spacers 100. Due to the high etch selectivity of the material of the etch stop layer 80 compared to polysilicon, the etch process stops at the etch stop layer 80. At this juncture, the etch stop layer 80 can be removed thereby exposing the first polysilicon layer 70, again using an etch process appropriate to the material of the stop layer 110, such as wet etching. This process, according to an aspect of the invention provides for the precise control of the thickness of the polysilicon gate layer for proper silicidation.

A metal layer (not shown) is blanket deposited over the semiconductor device 5 and above the exposed surface of the first polysilicon layer 70. In one embodiment of the present invention, the metal layer comprises nickel and may be deposited using conventional processes such as sputtering or an ALD process to a thickness of from about 20 Angstroms to about 1,600 Angstroms. In some embodiments, the metal layer could comprise cobalt, copper, molybdenum, titanium, tantalum, tungsten, erbium, zirconium, platinum, ytterbium, or a combination thereof. Other metals are within the contemplated scope of the present invention as well.

A thermal process such as rapid thermal anneal (RTA) is then performed on semiconductor device 5 to cause the metal layer to interact with underlying first polysilicon layer 70 and form a metal-silicide layer or silicided gate electrode 130. Numerous variations will be apparent to one skilled in the art with the benefit of the teachings contained herein and routine experimentation to obtain various fully silicided structures, including gate structures, of varying height. Following the silicidation step, the remaining metal layer that does not interact with first polysilicon layer 70 is removed. FIG. 7 shows the resulting structure having silicided gate electrode 130. Processing can continue with the formation of one or more metal interconnect layers (not shown), contacts (not shown), and connection with subsequently formed metal interconnects, as are well-known in the art for completing the semiconductor device 5.

The preceding disclosure was described with reference to exemplary embodiments of the present invention. It will, however, be evident that various modifications, structures, processes, and changes may be made thereto without departing from the broader spirit and scope of the embodiments of the present invention, as set forth in the claims. The specification and drawings are, accordingly, to be regarded as illustrative and not restrictive. It is understood that embodiments of the present invention are capable of using various other combinations and environments and are capable of changes or modifications within the scope of the inventive concept as expressed herein.

What is claimed is:

1. A method of forming a gate in a FinFET device, comprising:
    providing a fin on a substrate;
    forming at least one gate structure over the fin, the gate structure having a dielectric layer and a conformal first polysilicon layer formed above the dielectric layer;
    forming an etch stop layer above the first polysilicon layer;
    forming a second polysilicon layer above the etch stop layer;
    removing the second polysilicon layer and stopping at the etch stop layer;
    removing the etch stop layer;
    forming a metal layer above the first polysilicon layer;
    reacting the first polysilicon layer with the metal layer to silicide the first polysilicon layer; and
    removing any un-reacted metal layer.

2. The method of claim 1, wherein the first polysilicon layer has a thickness of from about 20 Angstroms to about 800 Angstroms.

3. The method of claim 1, wherein the etch stop layer comprises oxide, silicon oxide, nitride, silicon nitride, or silicon oxynitride.

4. The method of claim 3, wherein the etch stop layer has an etch selectivity higher than polysilicon.

5. The method of claim 1, wherein the etch stop layer has a thickness of from about 10 Angstroms to about 100 Angstroms.

6. The method of claim 1, wherein the second polysilicon layer has a thickness of from about 300 Angstroms to about 1,600 Angstroms.

7. The method of claim 1, wherein the metal layer comprises nickel, cobalt, copper, molybdenum, titanium, tantalum, tungsten, erbium, zirconium, platinum, ytterbium or a combination thereof.

8. The method of claim 1, wherein the reacting the first polysilicon layer comprises performing a rapid thermal anneal (RTA).

9. The method of claim 1, further comprising forming source and drain regions on opposite sides of the fin.

10. The method of claim 1, prior to the step of removing the second polysilicon layer, further comprising forming spacers on the sidewalls of the gate structure.

11. The method of claim 10, further comprising depositing a stop layer over the gate structure and the spacers and depositing an interlevel dielectric (ILD) layer above the stop layer.

12. The method of claim 10, further comprising removing portions of the ILD layer and the stop layer to expose a portion of a surface of the second polysilicon layer.

13. A method of forming a FinFET transistor, comprising:
    forming a fin on a substrate; and
    forming a gate structure over the fin, the gate structure having a dielectric layer and a conformal first polysilicon layer formed above the dielectric layer;
    forming an etch stop layer above the first polysilicon layer;
    forming a second polysilicon layer above the etch stop layer;

removing the second polysilicon layer and stopping at the etch stop layer;
removing the etch stop layer;
forming a metal layer above the first polysilicon layer;
reacting the first polysilicon layer with the metal layer to silicide the first polysilicon layer;
removing any un-reacted metal layer; and
forming source and drain regions on opposite sides of the fin.

14. The method of claim 13, wherein the first polysilicon layer has a thickness of from about 20 Angstroms to about 800 Angstroms.

15. The method of claim 13, wherein the etch stop layer comprises oxide, silicon oxide, nitride, silicon nitride, or silicon oxynitride.

16. The method of claim 15, wherein the etch stop layer has an etch selectivity higher with respect to polysilicon.

17. The method of claim 13, wherein the etch stop layer has a thickness of from about 10 Angstroms to about 100 Angstroms.

18. The method of claim 13, wherein the second polysilicon layer has a thickness of from about 300 Angstroms to about 1,600 Angstroms.

19. The method of claim 13, wherein the metal layer comprises nickel, cobalt, copper, molybdenum, titanium, tantalum, tungsten, erbium, zirconium, platinum, ytterbium or a combination thereof.

20. The method of claim 13, further comprising forming spacers on the sidewalls of the gate structure.

* * * * *